United States Patent
Fallahi et al.

(10) Patent No.: US 9,231,373 B2
(45) Date of Patent: Jan. 5, 2016

(54) MULTI-CHIP VECSEL-BASED LASER TUNABLE INDEPENDENTLY AT MULTIPLE WAVELENGTHS

(71) Applicant: The Arizona Board of Regents on Behalf of The University of Arizona, Tucson, AZ (US)

(72) Inventors: Mahmoud Fallahi, Tucson, AZ (US); Chris Hessenius, Tucson, AZ (US); Michal L. Lukowski, Tucson, AZ (US)

(73) Assignee: The Arizona Board of Regents on Behalf of the University of Arizona, Tucson, AZ (US)

( * ) Notice: Subject to any disclaimer, the term of this patent is extended or adjusted under 35 U.S.C. 154(b) by 0 days.

(21) Appl. No.: 14/426,956

(22) PCT Filed: Sep. 9, 2013

(86) PCT No.: PCT/US2013/058695
§ 371 (c)(1),
(2) Date: Mar. 9, 2015

(87) PCT Pub. No.: WO2014/039942
PCT Pub. Date: Mar. 13, 2014

(65) Prior Publication Data
US 2015/0288141 A1    Oct. 8, 2015

Related U.S. Application Data

(60) Provisional application No. 61/817,983, filed on May 1, 2013, provisional application No. 61/743,725, filed on Sep. 10, 2012.

(51) Int. Cl.
*H01S 5/14* (2006.01)
*H01S 3/07* (2006.01)
*H01S 3/08* (2006.01)
*H01S 5/40* (2006.01)
(Continued)

(52) U.S. Cl.
CPC . *H01S 5/141* (2013.01); *H01S 3/07* (2013.01); *H01S 3/0809* (2013.01);
(Continued)

(58) Field of Classification Search
CPC ....... H01S 5/141; H01S 5/022; H01S 5/4025; H01S 5/4087; H01S 5/423; H01S 3/07; H01S 3/08054; H01S 3/082; H01S 3/1062; H01S 3/109
USPC ......... 372/20, 23, 25, 29.02, 29.022
See application file for complete search history.

(56) References Cited

U.S. PATENT DOCUMENTS 5,333,142 A * 7/1994 Scheps ............. 372/22
5,528,612 A   6/1996 Scheps et al.
(Continued)

OTHER PUBLICATIONS

Moloney, et al., U.S. Appl. No. 12/643,618, filed Dec. 21, 2009, "Laser-Based Source for Terahertz and Millimeter Waves", pp. 1-90.
(Continued)

*Primary Examiner* — Dung Nguyen
(74) *Attorney, Agent, or Firm* — Yakov Sidorin; Quarles & Brady LLP

(57) ABSTRACT

A laser device capable to simultaneously generate light at multiple wavelengths that are independently (and, optionally, simultaneously) tunable without a limit of how small a spectral separation between such wavelengths can be made is enabled with the use of a laser-cavity network that (i) contains multiple spatially-distinct laser cavity portions all of which have at least one spatial region of the cavity network in common and (ii) is defined by such optical elements that prevent the intracavity amplification of light at first and second of multiple wavelengths at the expense of the same laser gain medium. Each of the distinct cavity portions contains a dedicated laser chip supporting the generation of light at a corresponding wavelength. In a special case, at least two of the multiple lasing wavelengths in the output of the device can be simultaneously and independently tuned to become equal.

18 Claims, 11 Drawing Sheets

(51) Int. Cl.
*H01S 5/42* (2006.01)
*H01S 5/022* (2006.01)
*H01S 3/082* (2006.01)
*H01S 3/106* (2006.01)
*H01S 3/109* (2006.01)

(52) U.S. Cl.
CPC .......... *H01S 3/08054* (2013.01); *H01S 5/4025* (2013.01); *H01S 5/4087* (2013.01); *H01S 5/423* (2013.01); *H01S 3/082* (2013.01); *H01S 3/109* (2013.01); *H01S 3/1062* (2013.01); *H01S 5/022* (2013.01)

(56) References Cited

U.S. PATENT DOCUMENTS 7,535,938 B2    5/2009    Luo et al.

2004/0190567 A1    9/2004    Lutgen et al.
2010/0195675 A1*   8/2010    Moloney et al. .................. 372/4

OTHER PUBLICATIONS

Chris Hessenius, et al., "High-Power Tunable Two-wavelength Generation in a Two Chip Co-Linear T-Cavity Vertical External-Cavity Surface-Emitting Laser", American Institute of Physics, Applied Physics Letters 101, 2012, pp. 1-4.

Mark Scheller, et al., "Room Temperature Continuous Wave Milliwatt Terahertz Source", Optical Society of America, Optics Express vol. 18, No. 26, Dec. 2010, pp. 27112-27117.

Chris Hessenius, et al., "Tunable Type II Intracavity Sum-Frequency Generation in a Two Chip Collinear Vertical External Cavity Surface Emitting Laser", Optics Letters, vol. 38, No. 5, Mar. 1, 2013, pp. 640-642.

* cited by examiner

MULTI-CHIP VECSEL-BASED LASER TUNABLE INDEPENDENTLY AT MULTIPLE WAVELENGTHS

CROSS-REFERENCE TO RELATED APPLICATIONS

This application claims the benefit of and priority from the U.S. Provisional Patent Applications No. 61/743,725 filed on Sep. 10, 2012, and titled "T-Shaped co-linear VECSEL for Two-Wavelength Operation" and No. 61/817,983 filed on May 1, 2013 and titled "T-Shaped co-linear VECSEL for Two-Wavelength Operation". The disclosure of each of the above-identified patent applications is hereby incorporated by reference for all purposes.

TECHNICAL FIELD

The present invention relates to a spectrally tunable multi-wavelength laser source and, in particular, to a T-shaped co-linear VECSEL-based source of laser light structured to generate light at at least two wavelengths each of which is tunable across a corresponding spectral range in a fashion that is completely independent from and not limited by the generation and/or tuning of light generated by the same source of laser light at another wavelength.

BACKGROUND

Most gas-phase species possess strong, fundamental vibrational modes in the mid-IR bands. This necessitates the development of tunable high power, compact, low-cost continuous wave (CW) mid-IR laser sources for numerous applications such as chemical and environmental monitoring, medical diagnostics, atmospheric transmission measurements, as well as military and security applications. Commonly used to-date CW sources of coherent mid-IR radiation include direct laser radiation devices (known as class 'A' laser sources) and sources the operation of which is based on nonlinear optical processes (referred to as class 'B' sources).

The development of class 'A' solid-state laser sources has been recently significantly advanced and includes quantum cascade (QC) lasers, rare-earth doped fiber lasers, inter-band cascade lasers (ICL) and type-II inter-band lasers, to name just a few. While these laser sources demonstrated promising performance across limited wavelength bands, at other wavelengths of interest their performance has been rather unsatisfactory due to some fundamental limitations.

The QC lasers, for example, showed promising performance in the wavelength range of 5-12 um. While operating in a CW mode, on the other hand, a QC laser converts up to 70% of the injected electrical power to heat, which has to be dissipated from the active region of the laser to enable the required room-temperature operation. Given that the area of the active region is approximately 100 $\mu m^2$, an efficient solution to address such dissipation to enable the QC generation of high-power single-mode coherent light continues to present a real challenge. In addition, for wavelengths shorter than 5 μm (for example, in the range between about 3 μm and 5 μm), the smaller energy gap between the upper laser state and the continuum states above the quantum wells results in a higher probability of carrier leakage into the continuum states, causing poor operational performance of a QC laser at these wavelengths at room temperature.

High power fiber lasers are widely used in the range from about 1 μm to about 2 μm (and $Ho^{+3}$-doped fiber laser devices have been developed to expand the emission wavelength towards 3 μm and achieve a near watt-level output power). At the same time, the performance of fiber lasers quickly degrades at wavelengths above 3 μm, even under cooling conditions. For wavelengths exceeding about 3.2 μm, the maximum output power obtained from the $Ho^{+3}$-doped fiber laser, for example, does not exceed the mW range. Similarly, while a laser source employing direct bandgap III-V semiconductors (for example, InGaSb/GaSb based materials) can operate in the 1.9-2.7 μm range at room temperature, and an exemplary room-temperature operation of a Sb-based semiconductor laser with output power of 80 mW was demonstrated at wavelengths up to 3 μm, the valence-band leakage and large Auger recombination significantly reduce, as a rule, the efficiency of operation at wavelengths above 2.8 μm. Another type of 'A' class laser—the vibronic solid-state laser—possesses broad gain bandwidths caused by phonon interaction. Sources utilizing $Cr^{2+}$ or $Fe^{2+}$-cations doped into II-VI compounds demonstrated laser emission in the range of 2 μm-3 μm. While a chalcogenide ceramic laser based on $Cr^{2+}$:ZnSe can produce high output power in a single longitudinal mode, both thermal lensing and quenching from multi-phonon emission remain among factors principally limiting the ability to scale the power output.

Class 'B' laser sources—in particular those employing difference frequency generation (DFG) to produce coherent mid-IR emission in a very broad wavelength band at room temperature—are commonly used as well. The recognized shortcoming of the majority of DFG-based lasers is their bulky structure and substantial dimensions, which stem from a need for a laser pump source (such as, for example, a Ti-Sapphire pump laser) producing high power, single mode emission. The diode-laser-pump-based alternative of a DFB class 'B' laser, on the other hand, does not produce yet a sufficiently high-power output (which is currently limited to about 10 mW) due to the fact that the output power of a single mode diode laser is typically below 1 W.

Optically-pumped vertical external-cavity surface emitting lasers (VECSELs) employing various III-V materials, have been subject to research in recent years and shown to provide a flexible high-brightness high-power output laser platform for generation of light in visible-IR wavelength bands. The major advantage of a VECSEL is that it utilizes a semiconductor quantum-well gain structure that opens a possibility to tailor the output spectrum of a VECSEL by means of band-gap engineering to provide specific solutions to a variety of applications in the near infrared. For example, VECSELs operating at different wavelengths between 670 nm and 2.8 um have been discussed in literature. In particular, InGaAs/GaAs strained quantum wells have been extensively researched and are capable of spanning the wavelength range from ~900 nm to 1200 nm. The open cavity design of a VECSEL provides access to the high intracavity power, which allows for wavelength tuning, linewidth control, and efficient intracavity nonlinear frequency conversion for not just single frequency operation, but also high-power nonlinear wavelength generation covering a range of wavelengths from the UV to the far IR regions of the spectrum (see, for example, M. Scheller et al., in *Optics Express*, v. 18, 21112, 2010; or S. Kaspar et al., in *Applied Phys. Letts.*, v. 100, 031109, 2012). A VECSEL laser operating at two different wavelengths is of interest in a range of applications including free-space wavelength-multiplexed optical communications as well as for optical distribution and generation of radar local oscillators and for nonlinear frequency generation of radiation from mid-IR up to THz frequencies for remote sensing applications (L. Fan et al., in *Appl. Phys. Letts.*, v. 90, 181124, 2007).

Although VECSELs utilizing multiple cavities, intra-cavity etalons, spatial mode splitting, or a multiple-quantum-well-based medium have been shown to generate light at two wavelengths, all VECSEL devices of related art lack the degree of tunability and efficiency of a single wavelength VECSEL source. In particular, the need for a VECSEL system structured to generate simultaneous light outputs at multiple wavelengths that are independently tunable and not limited by any particular mutual relationship (describing, for example, a limitation imposed on a characteristic of light at a first wavelength by light at a second wavelength) has not been addressed to date.

SUMMARY OF THE INVENTION

Embodiments of the invention provide a laser source structured to generate a spectrally tunable light output. Such laser source includes a laser cavity network containing at least one output coupler and multiple spatially-distinct cavity arms. Each of first and second arms of the cavity network is (i) structured to support intracavity circulation of laser light at at least one wavelength, (ii) employing a corresponding laser gain medium designed to amplify light at such at least one wavelength, and (iii) sharing a common portion of the laser cavity network containing a first output coupler through which the spectrally-tunable light output including multiple wavelengths is extracted from the cavity network. Portions of such light outputs at different wavelengths optionally spatially overlap. The laser source additionally includes at least one wavelength tuning mechanism juxtaposed with the laser cavity network and operable to tune a first wavelength of the multiple wavelengths regardless of the status of and independently from a second wavelength of the multiple wavelengths while allowing the first and second wavelengths to become equal (or spectrally coincide) as a result of tuning. In such a case, the spectrally-tunable light output includes light portions with bandwidths having substantially equal central wavelengths. In a specific embodiment, the first output coupler is the only output coupler of the laser source and, alternatively or in addition, the gain medium may include a VECSEL-based gain medium. In one embodiment, laser light portions corresponding to at least two of the multiple wavelengths co-linearly overlap in the common portion of the laser cavity network. The cavity network may be, in addition, specifically devoid of an intracavity optical resonator, and enable the laser operation mode in which both the first and second wavelengths are independently tunable with respect to one another. Optionally, at least one spatially-distinct cavity arm includes an element defining a pulsed operation of said laser source.

The laser source may additionally include a non-linear optical element disposed to define an operation of the laser source at a third wavelength defined by non-linear interaction of light at the first and second wavelengths. Optionally, the frequency of the spectrally-tunable output corresponding to the third wavelength can be tunable from a THz range of frequencies to a mid-IR range of frequencies. Optionally, the third wavelength corresponds to the ultra-violet portion of the optical spectrum. In one implementation, the laser source additionally includes a wavelength-selective element (disposed intracavity in one of the multiple spatially distinct cavity arms) operable to tune a spectral linewidth of light supported by said cavity arm, in addition or alternatively to the wavelength tuning of at least one spectral component of the laser output. Alternatively or in addition, the laser source of the invention may include, in the common portion of the laser cavity network, an optical element defining a spatial fold in the common cavity portions and forming Rayleigh regions of intracavity light beams corresponding to the first and second wavelengths, which Rayleigh regions spatially overlap in the spatial fold. Optionally, such spatial overlap of the Rayleigh regions includes a collinear spatial overlap.

Embodiments of the invention also provide a laser source having a single output coupler and are structured to generate a spectrally tunable light output (through such single output coupler) at multiple wavelengths. Such laser source includes a laser cavity network containing multiple spatially-distinct cavity arms, a first and a second arm of which each is (i) structured to support intracavity circulation of laser light at a corresponding wavelength from the multiple wavelengths; and (ii) containing a corresponding VECSEL gain medium designed to amplify light at the corresponding wavelength. The first and second cavity arms share a common portion of the laser cavity network, which common portion is traversed by light at the multiple wavelengths defining the light output. Moreover, the laser source includes a wavelength tuning mechanism disposed in the first cavity arm and operable to tune a first wavelength of light supported by the first cavity arm independently from a second wavelength of light supported by the second cavity arm while allowing said first and second wavelengths to become equal (or spectrally coincide) as a result of such tuning.

In one implementation, the laser source may contain (a) a wavelength-selective element disposed intracavity in one of the multiple spatially distinct cavity arms and operable to tune a spectral linewidth of light supported by such cavity arm, and/or (b) a laser-mode selector, in the first cavity arm, that defines a pulsed operation of the laser source at the first wavelength. In the specific case of the latter implementation, a portion of the spectrally-tunable light output at the second wavelength may include a continuous-wave light output, thereby providing a mix of pulsed and continuous-wave light output through the single output coupler. The common portion of the laser cavity network may be structured to include a spatial fold defined by the single output coupler and, optionally, an auxiliary optical element disposed in the spatial fold such as to support a non-linear frequency generation of light at a third wavelength. The spatial fold may be structured to effectuate the non-linear generation of light at the third wavelength to be collinear and coaxial with propagation of light at the first wavelength. In a specific case, the laser source is structured to be specifically devoid of an intracavity optical resonator to ensure that both the first and second wavelengths are independently tunable with respect to one another and to allow these wavelengths to spectrally coincide as a result of the tuning process.

BRIEF DESCRIPTION OF THE DRAWINGS

The invention will be more fully understood by referring to the following Detailed Description in conjunction with the Drawings, of which.

DETAILED DESCRIPTION

Figure 1:
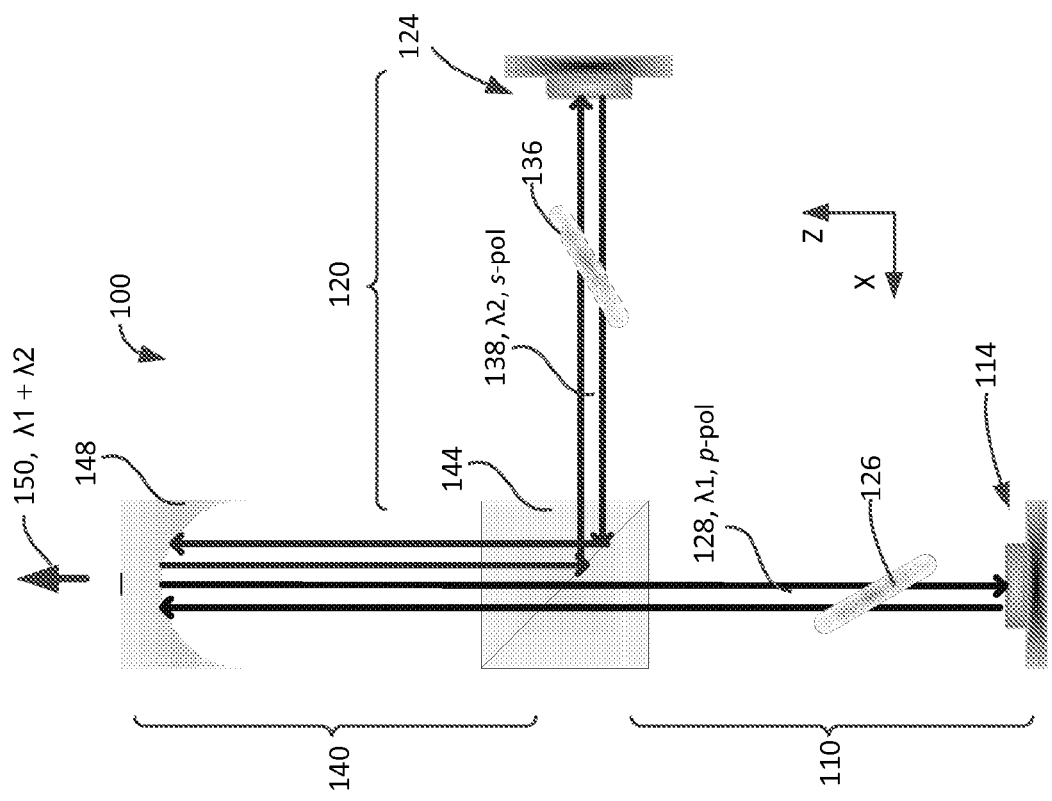
FIG. 1 is a diagram depicting schematically a specific embodiment of a multiple-gain-medium utilizing co-linear T-cavity VECSEL device structured for simultaneously multiple-wavelength light generation. The wavelength tuning elements (as shown, birefringent filters) are oriented in respectively corresponding arms of the cavity network such as to support intracavity circulation of multiple optical fields characterized by orthogonal polarizations.

The problem of enabling a laser device to simultaneously generate light at two or more wavelengths that are independently tunable without a practical limit of how small a spectral separation between such wavelengths can be made is solved by devising a laser-cavity network that contains multiple spatially-distinct laser cavity arms sharing at least one portion of the cavity network and defined by such optical elements that prevent the intracavity amplification of light at two of these wavelengths via amplification processes occurring in the same laser gain medium. Stated differently, an open cavity network of a laser device of the invention is structured to support a first process of laser light amplification at the first wavelength and a second process of laser light amplification at the second wavelength, which processes (i) do not share the same gain bandwidth but respectively correspond to different gain curves, and (ii) propagate along spatially different intracavity optical paths that share a common optical path portion along the direction of light propagation.

While the solution to the problem can utilize, generally, any appropriate laser gain medium such as, for example, a laser device optionally equipped with an external cavity (for example, an external cavity semiconductor diode laser), or a thin-click solid state laser, to name just a few, the presented non-limiting examples are built around a VECSEL device the cavity network of which is judiciously structured to include multiple cavity arms (each arm maintaining the intracavity circulation of light at a respectively corresponding lasing wavelength from multiple lasing wavelengths and including a respectively corresponding VECSEL gain medium) that spatially share a common region of the cavity network, within which common region the multiple lasing wavelengths are propagating collinearly and, in a specific case, along the same optical path. The instant spectral separation between independently tunable first and second of the multiple lasing wavelengths of such laser device is substantially unlimited, at least on the lower side. For example, while the first lasing wavelength of the laser device's output can be kept constant, the second lasing wavelength can be tuned from a wavelength that is shorter than the first wavelength to the point where the first and second wavelengths are equal (which corresponds to a zero spectral separation) and further across the first wavelength to a value that is longer than the first wavelength. Of course, the direction of the spectral tuning of one or each of the multiple lasing wavelengths the device can be arbitrarily chosen at the user's discretion. In one specific implementation, the portions of light generated by such laser device at first and second of the multiple lasing wavelengths form a high-power laser light output (typically, substantially greater than tens of mW of power—for example, at a multi-watt level such as greater than 1 W in a $TEM_{00}$ spatial mode output in the IR portions of the spectrum) having two independently tunable wavelengths at two mutually orthogonal polarizations.

Generally, the partially co-linear open cavity network of the proposed VECSEL device for multiple wavelength generation was built around a cavity design that had multiple spatial cavity sleeves or branches or arms extended transversely with respect to one another and sharing one common region (referred to as a co-linear cavity portion). Each of the branches included a corresponding VECSEL gain chip within the cavity. A VECSEL chip contained semiconductor quantum wells judiciously engineered to support light generation within large wavelength range (670 nm-2.4 um has been empirically shown). Accordingly, the simplest open cavity network of according to the idea of the invention had three spatially distinct cavity regions discussed further in reference to FIG. 1. The first arm 110 of the embodiment 100 (which contains a first VECSEL gain chip 114) supports the lasing at wavelength $\lambda_1$, while the second arm 120 (which contains a second VECSEL ship 124) supports the lasing at wavelength $\lambda_2$. A birefringent filter (BF) 126 in the arm 110 is oriented such that light 128 circulating along the arm 110 is p-polarized (TM lasing mode). A BF 136 of the arm 120, on the other hand, is oriented in such a way that the plane of incidence for light 138 circulating in the arm 120 defines s-polarization (TE lasing mode). Each of the BFs 126, 136 not only selects a linear polarization of the corresponding portion of intracavity light, but also facilitates the wavelength tuning operation of the device 100 in the corresponding arms 110, 120. It is intended that related embodiments of the invention can utilize different tuning mechanisms such as, for example, a spatially-repositionable intracavity diffraction grating or prism, an optical etalon, or an external cavity, or a temperature-tuning mechanism, to name just a few. According to one embodiment of the invention, each of the BFs includes quartz plates of optical quality oriented, with respect to planes of incidence of the respective intracavity fields 128, 138 such as to prevent optical coupling between these fields. The polarization selectivity in the cavity arms of the embodiment 100 can be achieved, for example, by placing the BF's at Brewster angle.

The optical field present in each of the regions 110, 120 is operationally independent from any other optical field in any other portion of the overall cavity of the device 100 and does not share the gain medium with any other optical field. Accordingly, auxiliary elements optionally present in regions 110, 120 interact only with the light fields at $\lambda_1$, $\lambda_2$, respectively. The common, co-linear region 140 of the cavity was the cavity portion between the beam splitter 144 and the output coupler 148, which was shared by the optical fields 128, 138. The PBS 144 ensured that p-polarized light 128 propagated unabated while the s-polarized light was reflected in a substantially transverse direction (in one implementation, at about 90 degrees, in another implementation—at about 120 degrees) with respect to the z-axis. In the cavity region 140, the two individual optical fields at wavelengths $\lambda_1$ and $\lambda_2$ overlapped spatially to form an overall optical intracavity field and the corresponding output 150 was characterized by the two wavelengths corresponding to two orthogonal linear polarizations. (As discussed further below, such intracavity arrangement facilitates non-linear frequency conversion of light.)

To demonstrate the operability of the device of the invention in absence of spectral tuning, the co-linear T-cavity network 100 of FIG. 1 was slightly modified by removing the BFs 126, 136. Two VECSEL chips structured as "bottom emitters" for operation in the vicinity of 975 nm were utilized. To this end, a semiconductor multi-quantum wells (MQW) and a high reflectivity (R~99.9%) distributed Bragg reflector (DBR) stack mirror made of $A_{10.2}G_{a0.8}As/AlAs$ were grown on an undoped GaAs substrate. The active region of the chip included 14 compressive-strained InGaAs quantum wells each about 8 nm thick and surrounded by GaAsP strain compensation layers and GaAs pump-absorbing barriers. As is typical in VECSEL structures, the thickness and composition of the layers were optimized such that each quantum well is positioned at an antinode of the cavity standing wave to provide resonant periodic gain (RPG). The chip also included a high aluminum concentration AlGaAs etch-stop layer between the active region and the substrate to ease the selective chemical substrate removal. In order to maximize the thermal management, the epitaxial side of the VECSEL wafer was solder bonded on a chemical vapor deposition (CVD) diamond. After the removal of the GaAs substrate the devices are mechanically mounted on a water-cooled copper heat sink. The output coupler 150 had a reflectance of about 94% in the spectral region of interest and a radius of curvature of about 30 cm. The total length of each of the coupled cavities (i.e., the total length of the cavity portions 110 and 140 and the total length of the cavity portions 120 and 140) was about 24 cm. Each of the chips 114, 124 was attached to a copper heat sink to be cooled to a temperature of about 15° C. and optically pumped at 808 nm over a pump spot diameter of about 500 microns.

Figure 2:
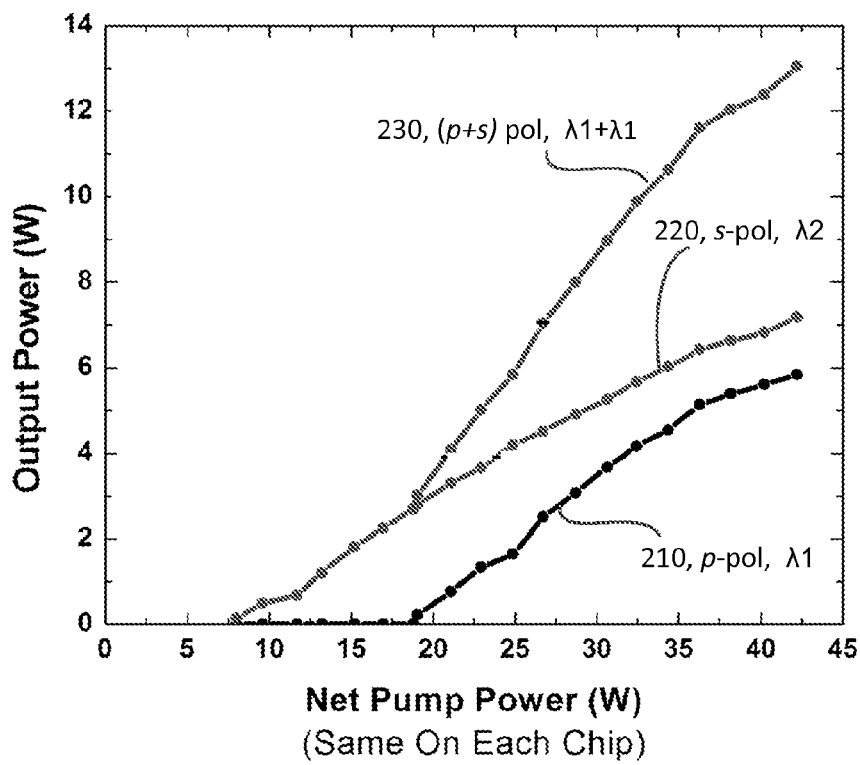
FIG. 2 illustrates the power output of the embodiment of FIG. 1 that has been modified by removing the birefringent filters.
Figure 3:
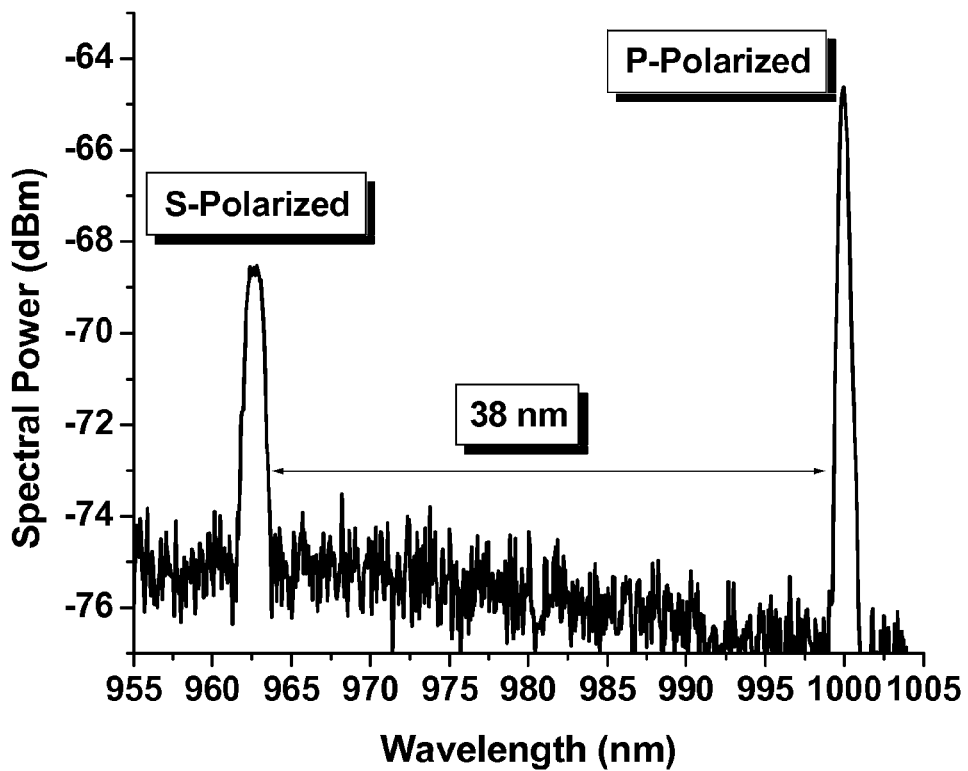
FIG. 3 is a plot showing the two-peak spectrum of the combined output of the embodiment of FIG. 1 that has been modified by removing the birefringent filters.

FIG. 2 illustrates the power output of the embodiment 100 after the described-above modification has been implemented, with the plots 210, 210 corresponding to one portion of the output (at $\lambda_1$ and $\lambda_2$, respectively) generated while the cavity arm corresponding to another portion of the output was blocked. Plot 230 represents the combined output. The independently operated VECSEL chips 114, 124 in the cavity 100 generated CW p-polarized and s-polarized light outputs at about 6 W and about 7 W, respectively. When both arms 110, 120 of the open cavity network 110 were operated simultaneously, the resulting aggregate output power amounted to about 13 W. FIG. 3 is a plot showing the two-peak spectrum of the combined output 150 (with both arms 110, 120 operational) where the laser system generated p-polarized light at about 1000 nm and s-polarized light at about 962 nm. Each lasing mode had a lasing linewidth of about 3 nm.

Figure 4:
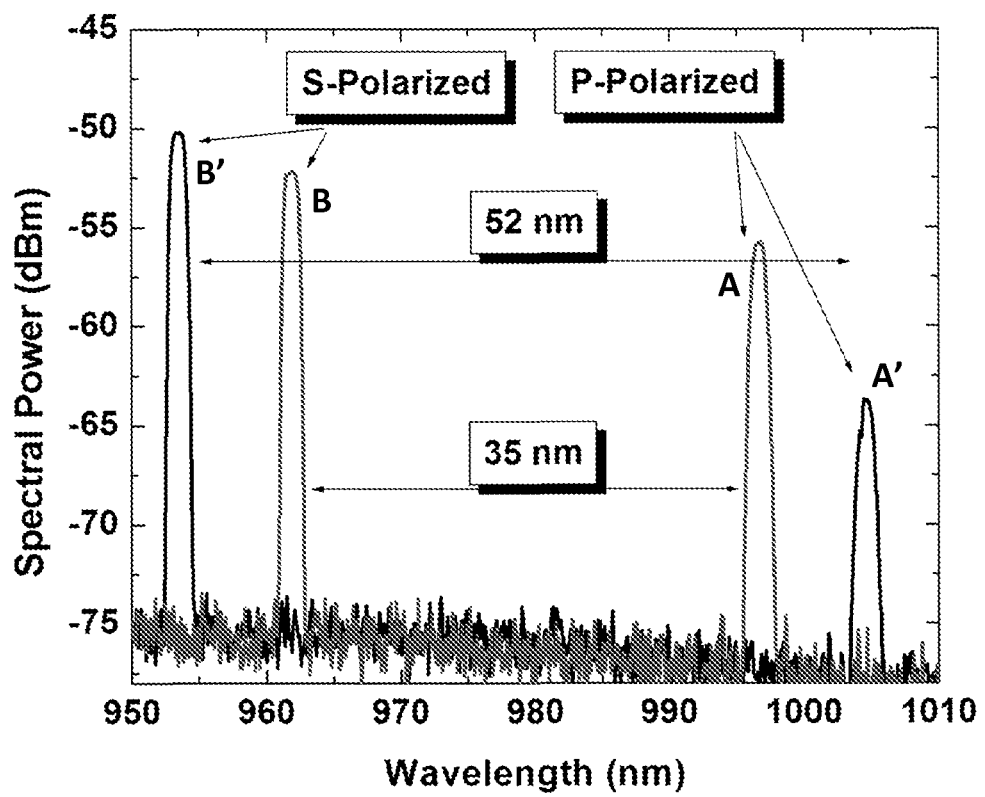
FIG. 4 illustrates the independent tuning of the two wavelengths present in the spectrum of the light output of the embodiment of FIG. 1.

The empirical results of independent and separate spectral tuning of light outputs at $\lambda_1$, $\lambda_2$ by independent and separate tuning of the cavity arms 110, 120, as well as the simultaneous tuning of the cavity network 100 are shown in FIG. 4. To this end, the embodiment 100 was equipped with a 99.9% reflectance output coupler 148. The pump spot diameter for each of VECSEL chips 114, 124 was maintained at about 500 um and data were collected with about 40 W of pump power absorbed into each chip. The spectral separation between the two lasing wavelengths $\lambda_1$, $\lambda_2$ (tuned, respectively, between points A, A' and B, B') was adjusted by rotating at least one of the BF's 126, 136 about an axis parallel toy-axis of FIG. 1. It would be appreciated by a person of skill in the art that, in stark contradistinction with VECSEL devices of the related art that employ a single VECSEL chip, not only the $\lambda_1$ and $\lambda_2$ outputs can be tuned completely independently from one another but the minimum spectral separation between the $\lambda_1$ and $\lambda_2$ outputs is not limited in practice, because such tuning operation are controlled by the center of the gain curve of each of the VECSEL chips 114, 124. It is possible, therefore, to choose the minimum desired separation between by adjusting geometrical parameters of the BF's 126, 136.

As the two orthogonally polarized light outputs at $\lambda_1$, $\lambda_2$ can be independently tuned, the use of semiconductor quantum wells characterized by gain curves with different spectral positions for the chips 114, 124 of the embodiment 100 can practically ensure that the tunable spectral separation between the two wavelength outputs ranges anywhere from zero nm to hundreds of nm, making the corresponding embodiments of the device of the invention well suited for wide range of high power intra-cavity type-II non-linear frequency generation. (Indeed, it is understood that the upper limit of the tuning range of at least one wavelength in the output 150 of the embodiment 100 relates, in practice, to the bandwidth of the gain medium that supports the generation of light at such wavelength. VECSELs are known to have a broad gain bandwidth and have demonstrated tuning ranges on the order of 50 nm. By appropriately designing the resonant periodic gain structure as well as varying the widths of the quantum wells of a given VECSEL medium for use with an embodiment of the invention, it could be possible to achieve spectral tuning across the range on the order of 100 nm at the fundamental wavelength for each of the VECSEL chips 114, 124. As such, each sample in the T-cavity configuration could be tuned over a 100 nm band independently.) Such design lends itself to the generation of high power laser outputs in spectral regions that have traditionally remained out of reach. Provided that in the conducted experiment the thicknesses of the BF's 126, 136 were limited to about 1 mm and about 2 mm, respectively, the spectral separation between the $\lambda_1$ and $\lambda_2$ could be tuned from about 35 nm to about 52 nm. The co-axial distribution of light output portions $\lambda_1$, $\lambda_2$ in the output 150 was proven by measuring the Gaussian profiles of the output beams at each of the wavelengths and both wavelengths together.

Figures 5, 6:
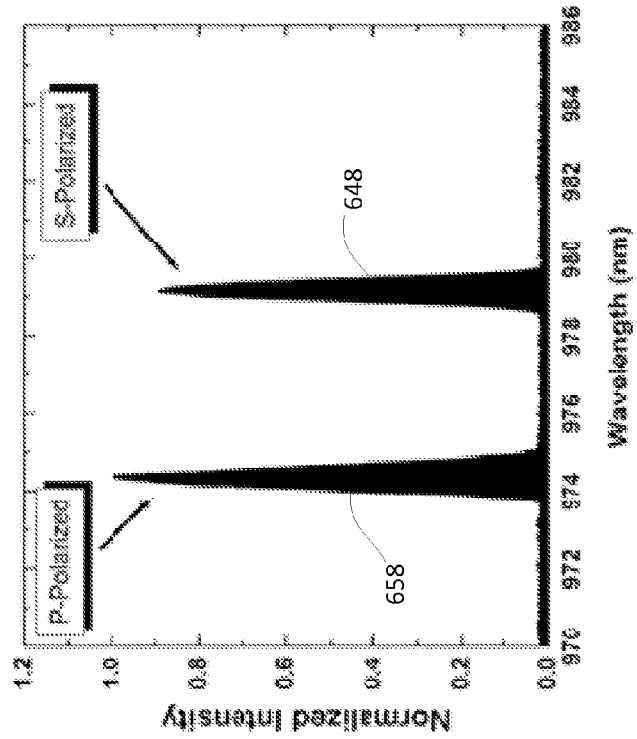
FIG. 5 is a diagram schematically illustrating an embodiment of the co-linear T-cavity VECSEL device of the invention structure for type-II sum frequency generation or difference frequency generation.
FIG. 6 is a plot showing instantaneous spectra corresponding to the two simultaneously lasing fundamental spectral modes of the T-cavity of the embodiment of FIG. 5.

A related embodiment 500 of the invention is schematically shown in FIG. 5 and shows a two chip co-linear T-cavity VECSEL device that folds a portion of intracavity light 138

(s-polarized) about a polarizing beamsplitter 144 while allowing the second portion of light 128 (p-polarized) to pass through the splitter 144 unabated. This implementation lends itself to implementing a tunable intracavity type II sum frequency generation (SFG) to achieve high-power, high stability light output 150 in the blue-green spectral bands. The T-cavity includes three spatially distinct cavity regions or portions or sections 110, 120, 510 each of which supports VECSEL's lasing in a distinct fashion. As was discussed in reference to FIG. 1, the spatially distinct cavity portions 110, 120 are structured to support independent lasing at wavelengths λ1, λ2 and at orthogonal polarizations, while the collinear cavity section 510 is shared by (is common to) intracavity light portions 128, 138. As a result, independent generation and tuning of each lasing wavelength λ1, λ2 is enabled over a wide range defined by different semiconductor gain bands corresponding to different gain media 114, 124.

The collinear cavity portion 510 (defined by the intracavity optical path from the PBS 144 to the output coupler 512 to the high-reflectance optionally flat mirror 514) includes a cavity fold 540. The output coupler 512 is appropriately shaped and positioned such as to form a Rayleigh region of an intracavity light beam propagating between the output couple 512 and the mirror 514 substantially in the region of the fold 540 itself, where the non-linear optical medium 526 can be placed (in which case the cavity modes lasing at $\lambda_1, \lambda_2$ spatially overlap at the medium 526). The formation of the cavity fold 540 allows the light at the fundamental wavelengths $\lambda_1, \lambda_2$ to be substantially overlapping and co-propagating along the corresponding Rayleigh ranges to maximize the efficiency of the non-linear frequency conversion. This flexibility in beam size control facilitates efficient sum or difference frequency generation in the embodiment of the device. (Similar folding of a collinear cavity can be employed with any of other embodiments of the invention.)

In one implementation of the embodiment 500, strain compensated InGaAs/GaAs/GaAsP multi-quantum well (MQW) structures capable of emitting light in the proximity of 980 nm were used. The "bottom emitting" VECSEL structure included an active region containing 14 QWs (each of about 8 nm thick), surrounded by GaAsP strain compensation layers and GaAs pump absorbing barriers. A high reflectivity (R~99.9%) distributed Bragg reflector (DBR) mirror made of alternating $Al_{0.2}Ga_{0.8}As/AlAs$ was grown on top of such MQW structure. The thickness and composition of the layers were designed such that each QW be positioned at an antinode of the cavity standing wave to provide resonant periodic gain (RPG). In order to facilitate selective substrate etching process, a thin high aluminum concentration AlGaAs etch—stop layer is initially grown on the GaAs substrate prior to the active layers growth. The VECSEL structure fabrication process included solder-bonding the epitaxial side of the wafer on a high thermal conductivity chemical vapor deposition (CVD) diamond followed by substrate removal through a selective wet etching process. (See, for example, C. Hessenius et al., in Proc. Of SPIE, v. 8242, 82420E, 2012). The processed devices were mechanically mounted on a water-cooled copper heat sink for temperature control.

In practice, a pump spot diameter of ~500 microns was used on each of the chips 114, 124. (It is understood, however, that the same or different appropriately chosen pump-spot-diameter pump beams can be employed, for example as large as 1 to 2 mm, in some cases). The distance from the surface of each of the chips 114, 124 to the curved OC 512 was about 19 cm and the distance from the curved OC 512 to the HR flat mirror 514 was about 6 cm. The temperature of the gain media 114, 124 was maintained at about 15 C. The flat end mirror 514 incorporated a broadband HR coating, while the coating at the surface of the curved OC 512 exhibited high reflectance (of about 99.9%) at a fundamental lasing wavelength and low reflectance (for example, less than 0.25%) for the blue-green portion of the light output 550. It is understood that when the two VECSEL chips 114, 124 are chosen from the same wafer growth, very spectrally close or nearly identical gain curves and, therefore, gain center wavelengths can be provided to support the intracavity optical fields 128, 138. The spectral separation between the wavelengths λ1, λ2 is adjusted by controlling the angular orientation of the BF(s) 126, 136 rotation and individual wavelength tuning of each polarization.

FIG. 6 illustrates an output spectrum obtained from the above-described embodiment of the device in the spectral region corresponding to the fundamental wavelengths λ1, λ2. As the BF 136 was thicker than the BF 126, the linewidth 648 for the s-polarized light portion 138 was narrower than that (658) for the light portion 128. More than 100 mW of the combined two-color output 550 (combined outputs at the fundamental wavelengths λ1, λ2 and at the summed-frequency, SF) was measured indicating hundreds of watts of intracavity circulating power for each of the lasing modes 128, 138. Such high circulating power is very critical for efficient intracavity nonlinear frequency conversion.

The spectral tuning capability of the device was demonstrated in two ways: by tuning the simultaneously lasing wavelengths λ1, λ2 and by tuning the SF portion of the output 550.

Figure 7:
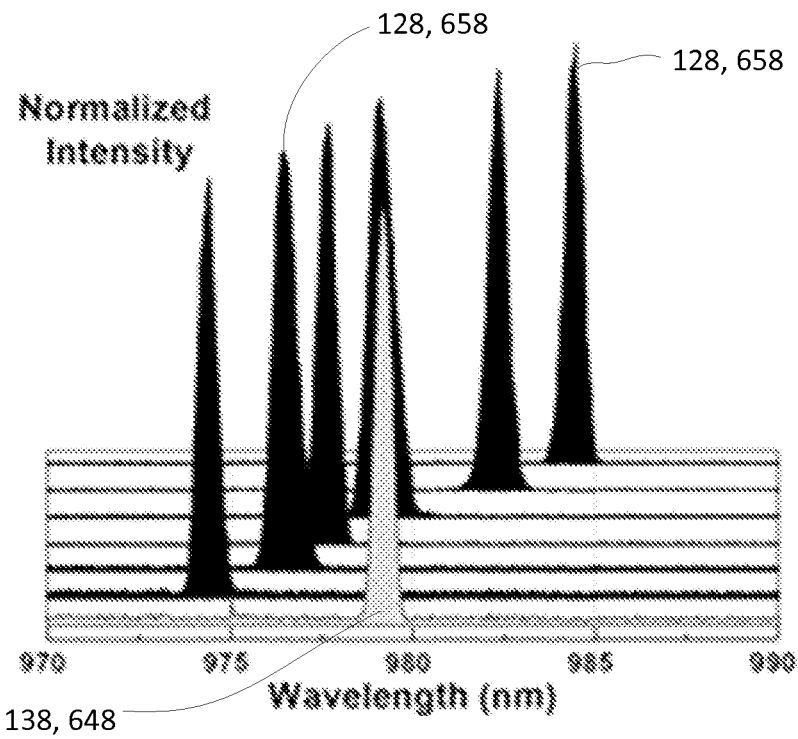
FIG. 7 shows empirically observed tuning of one of the fundamental spectral modes supported by the T-cavity of the embodiment of FIG. 5 across another fundamental spectral mode simultaneously lasing in the same cavity.

The tuning of the lasing wavelengths λ1, λ2 was carried out, in one instance, by maintaining the s-polarized lasing mode 138 at about 979 nm while tuning the p-polarized lasing mode 128 about the gain peak of the medium 114 by rotating the BF 126. FIG. 7 shows the two-color spectral tuning of the lasing wavelength(s) of the embodiment 500. Near the vicinity of the gain peak, the wavelength of the p-polarized optical field 128 was efficiently tuned from about 974 nm to about 984 nm, from a spectral point separated from λ2~979 nm by about 5 nm (whether from below or from above the 979 nm point), through the 979 nm, and to the other side of the of the spectral position of λ2. The spectral separation was controlled at the user's discretion from ±5 nm down to zero nm. As shown, the coupled through the collinear cavity portion 510 cavity arms 110, 120 support lasing at the same wavelength, which is a unique technical feature not addressed thus far by related art (and which does not depend on the presence of the cavity fold 540 and/or on the presence of the NL medium 526, as would be readily understood by a skilled artisan). In fact, simultaneous lasing at two distinct wavelengths separated by a spectral gap substantially less than 1 nm in practice is typically very difficult (if not impossible) to achieve in a VECSEL device of the related art in which optical fields at both lasing wavelengths draw amplification from the same gain bandwidth (or in a VECSEL device utilizing a single gain medium). An example of this was provided in U.S. patent application Ser. Nos. 12/643,618; 12/285,856 the disclosure of each of which is incorporated herein by reference, or by M. Scheller et al. (in Optics Express, v. 18, 27112, 2010). Moreover, there the situation was even more exacerbated by the use of an intracavity optical resonator such as a Fabry-Perot etalon that further limited the possibly achievable spectral separation between the simultaneously lasing multiple optical fields to the free spectral range of the etalon. In advantageous contradistinction with the teachings of the related art, however, embodiments of the present invention possess spatially distinct multiple arms of the T-cavity that share only a portion of the common optical path, are equipped with gain media disposed such that light portions at first and second wavelengths generated by the laser device of the invention are not amplified based by the same gain medium. This by itself substantiates the empirical results discussed above. Furthermore, embodiments of the invention are devoid of any intracavity element that operationally limits the tunable spectral separation between multiple simultaneously lasing wavelengths to any pre-determined value. In one specific case, for example, a laser device of the invention is devoid of an optical resonator disposed intracavity. As a result, not only a larger tuning spectral separation between the multiple simultaneously lasing optical fields can be achieved by individual tuning of each gain medium's wavelength within its correspondent gain bandwidth, but also a zero spectral separation between such fields becomes available. Additional operational flexibility of the proposed T-cavity VECSEL design also accommodates using gain media (chips) with different spectral position of corresponding gain peaks.

Figure 8B:
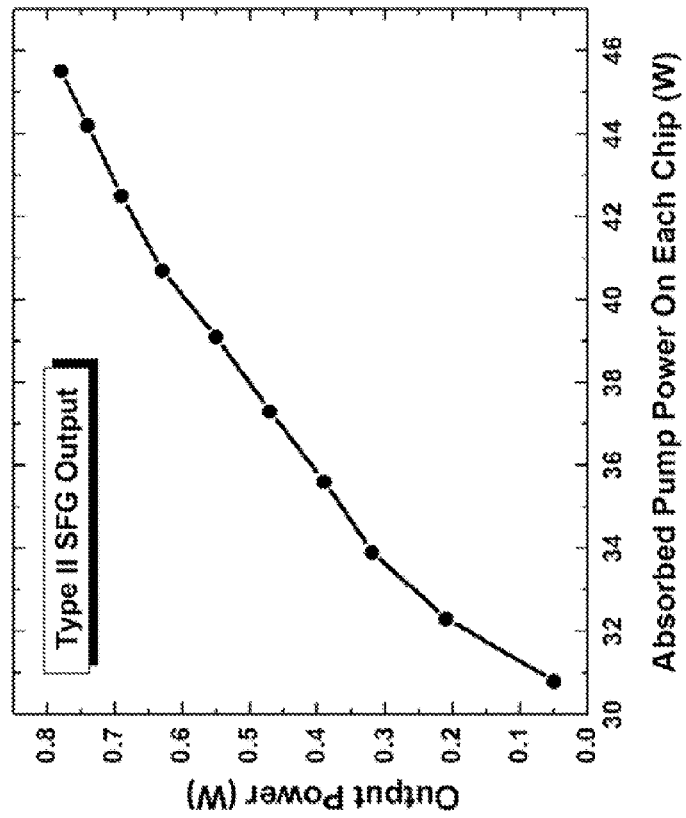
FIG. 8B is a plot illustrating change in the output power of the sum frequency output produced by the embodiment of FIG. 5.
Figure 8A:
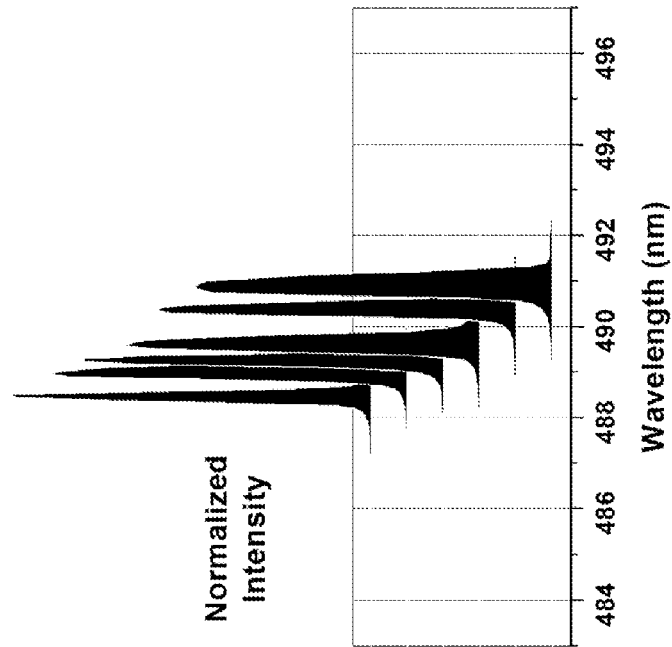
FIG. 8A is a plot illustrating the tuning of the sum-frequency portion of the light output generated by the embodiment of FIG. 5.

Referring now to FIGS. 8A and 8B, and in further reference to FIG. 5, with the two VECSEL chips 114, 124 operating at different orthogonally polarized lasing wavelengths, a lithium triborate (LBO) nonlinear crystal 526 (cut at about 3 mm×3 mm×10 mm with θ=32 deg and φ=90 deg to satisfy type II sum frequency generation, SFG) was inserted near the HR flat mirror 514. Each facet of the crystal 514 was coated to achieve low-reflectance value (for example, less than 0.25%) for λ1, λ2—980 nm and SH~490 nm. FIG. 8A illustrates the tunable SH-portion of the light output 550 corresponding to the tuning of the fundamental modes 128, 138 of FIG. 7. A larger than 3 nm tunable range of the blue-green SH was achieved by only tuning the p-polarized lasing mode 128 and limited by the thickness of the employed BF 126. Additional tuning can be achieved by rotating the BF 138. The type-II SFG VECSEL of the embodiment 500 also has an advantage over type-I SFG, in that only the sum frequency signal is generated. Indeed, type-I SFG with closely-spaced fundamental lasing wavelength can also generate two additional peaks corresponding to the second harmonic being generated. A type II crystal cut eliminates the SHG peaks since the crystal needs orthogonal polarization.

Figure 8C:
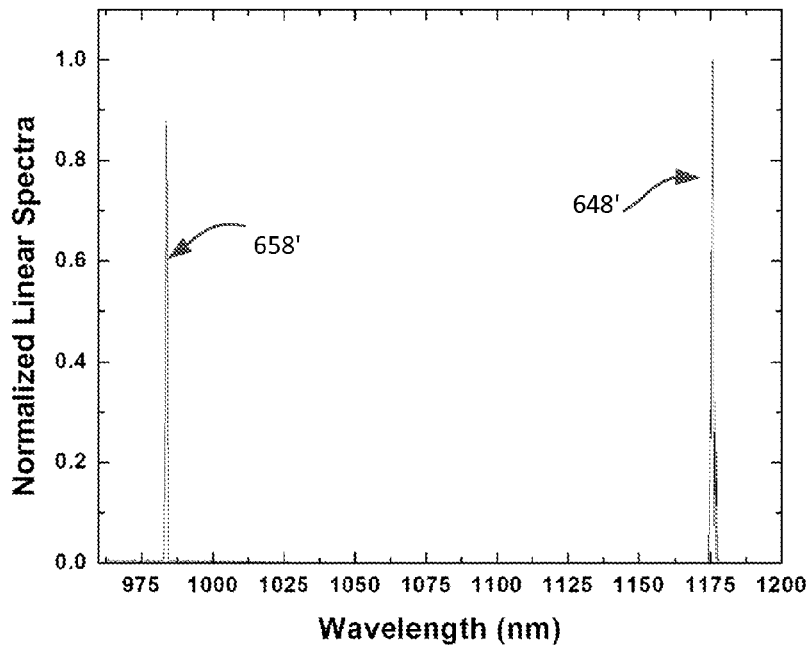
FIGS. 8C, 8D illustrate, respectively, instantaneous spectra corresponding to the two simultaneous lasing fundamental lasing modes of the embodiment of FIG. 5 and the tuning of the corresponding light output at the summed frequency.
Figure 8D:
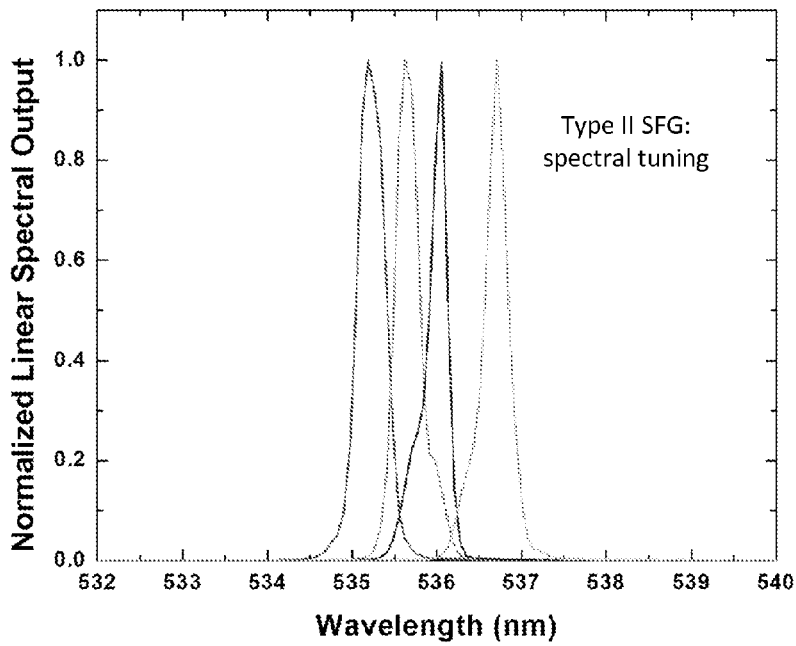

In reference to FIG. 8B, the SFG power of the output 550 was measured, in a clear TEM00 spatial mode, by monitoring the pump power absorbed into each of the VECSEL chips 114, 124. The maximum output power of more than 780 mW was recorded despite a relatively low effective nonlinear coefficient of ~0.57 pm/V at this wavelength for a type II cut LBO crystal. Greater outputs can be achieved through the use of other nonlinear crystals with larger coefficients. Some minimal fluctuations in the observed output SF power are explained by insufficient stabilization of the T-cavity of the embodiment 500 were observed since neither cavity was actively stabilized. FIG. 8C illustrates similar empirical results achieved with the use, in the embodiment 500 of FIG. 5, of different VECSEL media 114, 124 structured to respectively generate light 648', 658'. FIG. 8D shows the plots representing empirically realized tunable sum-frequency generation corresponding to the fundamental wavelengths of light 648', 658'.

Figure 9:
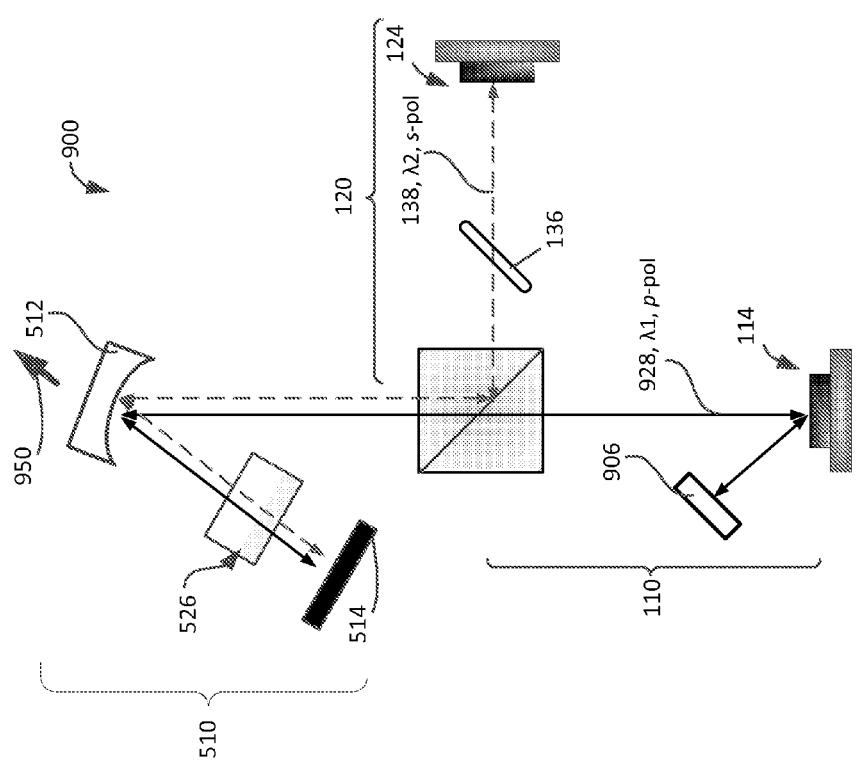
FIG. 9 is a diagram illustrating the modified embodiment of FIG. 5 in which the SESAM device is included into one of the arms of the T-cavity to combine a mode-locked optical field with the CW optical field at the location of the NL crystal in the common, co-linear portion of the T-cavity.

Another related embodiment 900, schematically shown in FIG. 9, can be realized by modifying the embodiment 500 of FIG. 5 to add a semiconductor saturable absorber mirror (SESAM) 906 into one of the multiple spatially-distinct arms of the folded T-cavity (as shown, in the arm 110) to mode-lock (or, alternatively, to achieve the operation in a Q-switching regime), as understood by a person of skill in the art, the corresponding optical field (in this case, the intracavity field 928 at $\lambda_1$). (In a related embodiment, a different element facilitating such pulsed operation—for example, a mechanical beam shutter or an electro-optical cell, or a rotating mirror—can be used). In the embodiment 500, the cavity arm 110 devoid of a BF supports the optical field 928 with a large, substantially fixed spectral bandwidth and in a pulsed regime, while the cavity arm having the BF 136 supports the tunable CW optical field 138. As a result, the now pulsed optical field 928 corresponding to the arm of the T-cavity in which the SESAM device has been introduced, is combined at the NL medium 526 with the continuous wave (CW) field 138 supported by another cavity arm 120 to cause the generation of high-peak power (with peak powers on the order of a kW and/or a W-level average optical power) pulsed output 950 containing at least one of the sum frequency and the difference frequency light.

Yet another implementation (not shown) of the device of the invention can utilize an appropriately coated semitransparent reflector in place of the PBS 144 of, for example, the embodiment 500 of FIG. 5. Such modified embodiment was implemented for a multi-gain medium VECSEL device enabled to generate, in a spectrally tunable fashion, $\lambda_1$ in the vicinity of 980 nm and $\lambda_2$ in the vicinity of 1200 nm. Accordingly, the semitransparent reflector used instead of the PBS 144 was AR-coated for 980 nm and HR-coated for 1200 nm. Depending on additional structural considerations, as would be appreciated by a skilled artisan, the corresponding light portions 128, 138 can be judiciously chosen to be either similarly polarized or, in the alternative, polarized orthogonally with respect to one another. Depending on the choice of the polarizations of the light portions 128, 138, type I, type II, or even quasi-phase-matched (QPM) nonlinear linear elements can be employed in the cavity fold 540 (in place of the element 526) for corresponding type of the frequency conversion.

Figure 10:
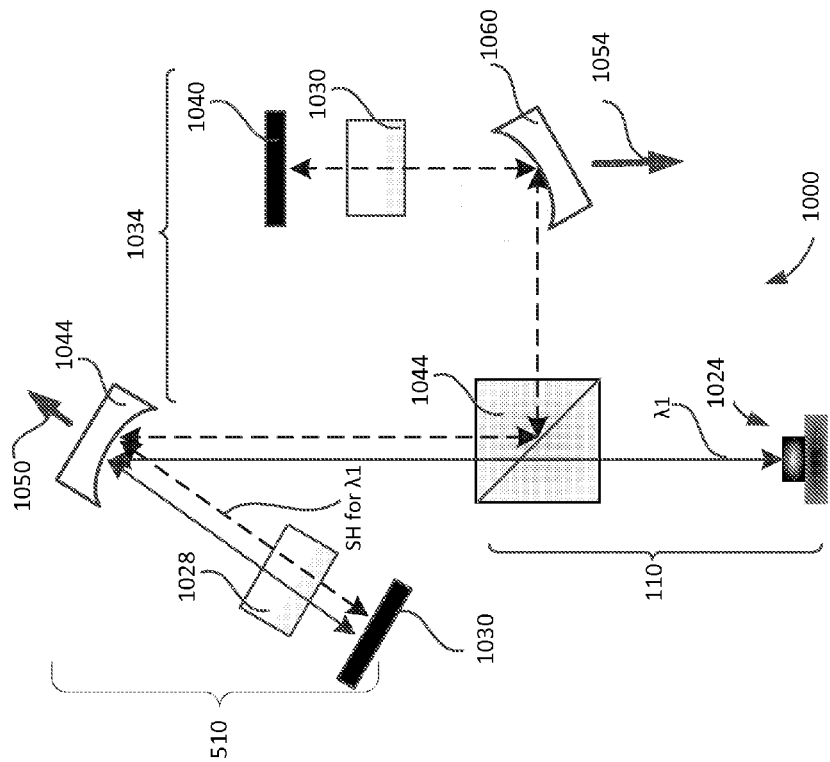
FIG. 10 is a diagram illustrating a T-cavity VECSEL structured to generate the UV light (optionally, in addition to the generation of the IR and/or visible light)

In reference to FIG. 10, another related embodiment 1000 structured based on the modification of the embodiment 500 of FIG. 5, for example, employs the gain medium 1024 and two non-linear media elements 1028 (in the fold 540 of the T-cavity) and 1030 in the cavity arm 1034. The element 1028 is chosen for non-linear conversion of light at IR wavelength $\lambda_1$ to visible light (at least one of which can be optionally extracted from the T-cavity through the appropriately coated output coupler 1050). For example, when $\lambda_1$~980 nm, the type I SHG in the element 1028 can be realized to generate SH light at about 490 nm and polarization that is orthogonal to that of the light at $\lambda_1$. The intracavity circulation of the SH optical field is further supported by a portion of the T-cavity including the arm 1034 that is terminated with a mirror 1040 in order to generate, with the use of the non-linear element 1030, the UV output 1054 (for example, at about 245 nm) extracted through the output coupler 1060. (It is understood that, while the PBS 1044 is shown, the non-polarizing semitransparent mirror can be used instead depending on whether it is desired to have different intracavity optical fields be similarly or orthogonally polarized. Spectral tenability can be realized, for example, with the use of an angularly re-adjustable BF 1064)

Figure 11:
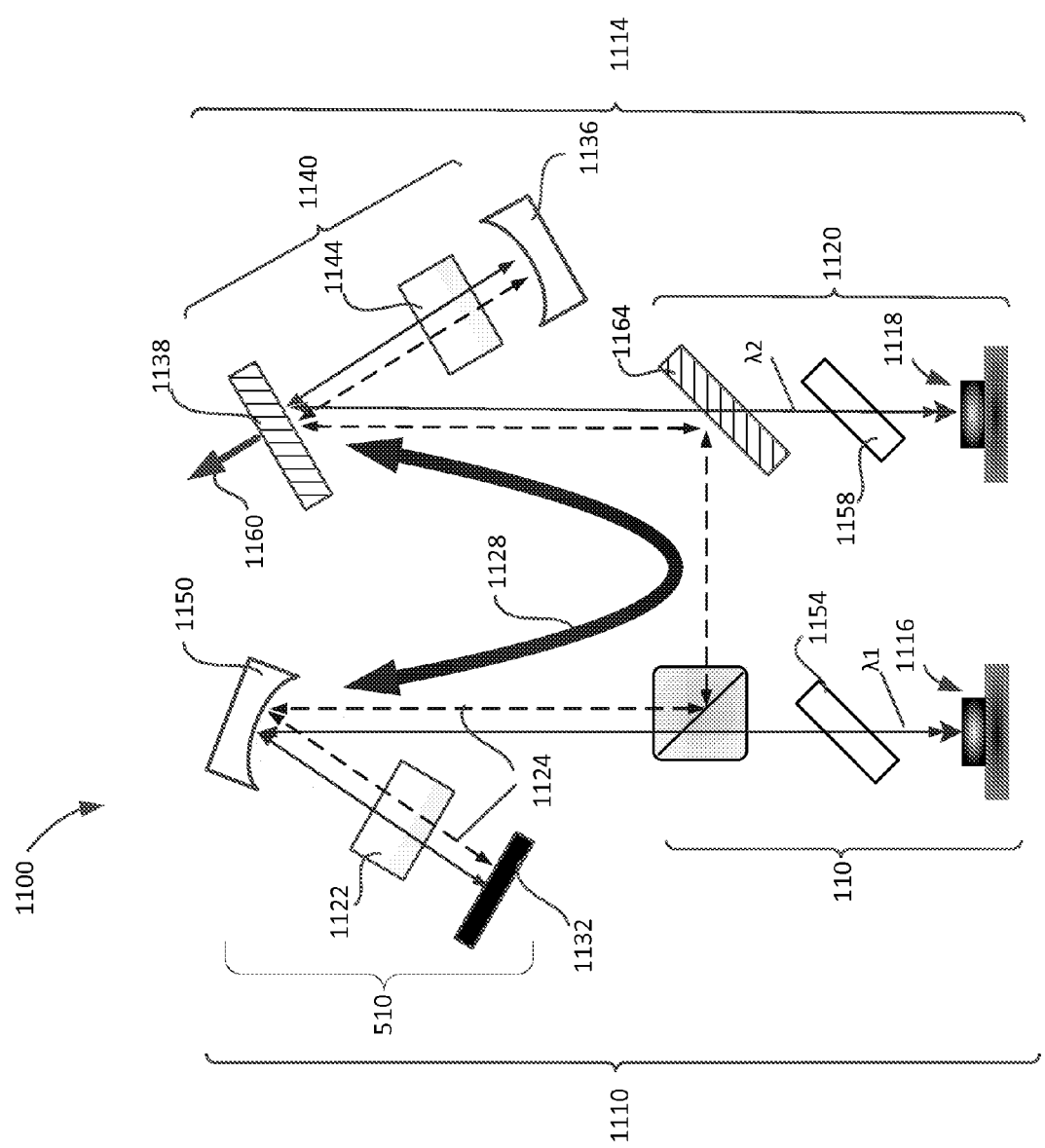
FIG. 11 is a diagram illustrating an alternative embodiment of the invention structured to generate UV light based on non-linear combination of the second-harmonic light generated in one of the portions of the overall cavity network with light at the fundamental harmonic from another cavity portion.

FIG. 11 illustrates yet another alternative embodiment 1100 of the device of the invention, structured to generate the UV light. Here, the cavity portions 1110, 1114 (each utilizing a different VECSEL gain medium, 1116 and 1118, to generate light at 22, respectively) operate independently at the corresponding fundamental wavelengths $\lambda_1$, $\lambda_2$ while sharing an optical field 1128 at a second harmonic generated in the optical fold 510 of the cavity portion 1110 equipped with the NL-optical element 1122 chosen to convert $\lambda_1$. This intracavity SH light 1024 circulates, as shown with an arrow 1128, within a cavity portion terminated with the mirrors 1032, 1036 the latter of which (aggregately with the output coupler 1038) defines the cavity fold 1140 of the cavity portion 1114. When the judiciously chosen non-linear element 1144 is present across the optical path in the fold 1140, at least a portion of the circulating in optical field 1024 is further converted to the light at the SH of the field 1024. Light at at least one of the above identified wavelengths can be extracted through at least one of the output couplers 1138, 1150. The spectral tuning is realized, for example, by angular re-adjustment of at least one of the optional BFs 1154, 1158.

In a non-limiting example, and in further reference to FIG. 11, when the VECSEL gain media 1116, 1118 are chosen from the same wafer to ensure that $\lambda_1$ is substantially equal to $\lambda_2$ (for example, $\lambda_1$, $\lambda_2$~980 nm), the light output 1160 from the output coupler 1138 can include UV light at about 316 nm. It is appreciated that a beamsplitter (optionally, polarizing, or an appropriately coated dichroic mirror) can be used as the reflector 1164 of the cavity portion 1114. As understood by a skilled artisan, the latter permits additional optical coupling of the cavity portions 1110, 1114 of the multi-chip VECSEL device 1100 to enable the generation of light at sum-frequency wavelength(s), whether the type I or type II, depending on the type of the beamsplitter used.

It is realized, therefore, that among the unexpected and not addressed to-date by the related advantages of the proposed approach to structuring a T-cavity VECSEL device to simultaneously generate light at multiple wavelengths, one provides a solution to a long-felt need for independent and substantially arbitrary spectral tuning of the multiple wavelengths, which is not limited by how small the spectral separation between the lasing wavelengths can be practically achieved. Due to the fact that multiple optical fields supported intracavity by embodiments of the invention are not fed by the amplification processes rooted in the same gain profile but, instead, utilize different gain media present in the same cavity network, such tuning of one of the multiple lasing wavelengths was realized in reference to another of the multiple lasing wavelengths that permitted these two wavelengths coincide when required. This, in turn, enabled the intracavity generation of additional frequencies—from UV to mid-IR (corresponding to the separation on the order of tens of nm between the fundamental wavelengths of the system) to THz range (corresponding to a near-zero spectral separation between the fundamental wavelengths of the system)—via, for example, the nonlinear frequency conversion processes. The extent of spectral tuning of a chosen lasing wavelength may vary dependent, in part, on the bandwidth of the corresponding gain profile and the optical properties of the tuning element (in the examples discussed—an BF that is free of an optical resonator characteristic). The mode of operation of the proposed embodiments can be additionally modified by employing auxiliary intracavity elements to realize mode-locked operation, power scaling, and narrowing of linewidth of a chosen spectral output, to name just a few.

The following notes are in order. References made throughout this specification to "one embodiment," "an embodiment," "a related embodiment," or similar language mean that a particular feature, structure, or characteristic described in connection with the referred to "embodiment" is included in at least one embodiment of the present invention. Thus, appearances of these phrases and terms may, but do not necessarily, refer to the same implementation. It is to be understood that no portion of disclosure, taken on its own and in possible connection with a figure, is intended to provide a complete description of all features of the invention.

In addition, the following disclosure may describe features of the invention with reference to corresponding drawings, in which like numbers represent the same or similar elements wherever possible. It is understood that in the drawings, the depicted structural elements are generally not to scale, and certain components may be enlarged relative to the other components for purposes of emphasis and clarity of understanding. It is also to be understood that no single drawing is intended to support a complete description of all features of the invention. In other words, a given drawing is generally descriptive of only some, and generally not all, features of the invention. A given drawing and an associated portion of the disclosure containing a description referencing such drawing do not, generally, contain all elements of a particular view or all features that can be presented is this view, for purposes of simplifying the given drawing and discussion, and to direct the discussion to particular elements that are featured in this drawing. A skilled artisan will recognize that the invention may possibly be practiced without one or more of the specific features, elements, components, structures, details, or characteristics, or with the use of other methods, components, materials, and so forth. Therefore, although a particular detail of an embodiment of the invention may not be necessarily shown in each and every drawing describing such embodiment, the presence of this detail in the drawing may be implied unless the context of the description requires otherwise. In other instances, well known structures, details, materials, or operations may be not shown in a given drawing or described in detail to avoid obscuring aspects of an embodiment of the invention that are being discussed. Furthermore, the described single features, structures, or characteristics of the invention may be combined in any suitable manner in one or more further embodiments.

Moreover, if the schematic logical flow chart diagram is included, the depicted order and labeled steps of the logical flow are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method.

As was already alluded to above, the idea of the invention addresses the problem of forming a laser source capable of generating a single light output containing multiple wavelengths that are independently tunable, while allowing first and second of such multiple wavelengths to coincide as a result of the tuning process. Such problem was solved by devising a laser with a cavity network that contains multiple spatially distinct cavity arms structured such that each arm (i) supports intracavity circulation of laser light at at least one wavelength from the multiple wavelengths, (ii) employs a corresponding laser gain medium capable of amplifying light at such at least one wavelength, and (iii) contains a corresponding mechanism for varying an optical path of the arm. Moreover, in the devised cavity network, at least two of these multiple spatially distinct cavity arms share a common cavity portion containing an output coupler through which the generated single light output is extracted from the laser cavity network. The idea of the invention also addresses the problem of forming a laser source capable of generating a single light output at multiple wavelengths that are independently tunable and a wavelength resulting from a non-linear conversion of at least one of the multiple wavelengths, while allowing first and second of such multiple wavelengths to coincide as a result of the tuning process. Thus problem, in turn, was solved by devising a laser with a cavity network that contains multiple spatially distinct cavity arms structured such that each arm (i) supports intracavity circulation of laser light at at least one wavelength from the multiple wavelengths, (ii) employs a corresponding laser gain medium capable of amplifying light at such at least one wavelength, and (iii) contains a corresponding mechanism for varying an optical path of the arm. Moreover, in such devised cavity network at least two of these multiple spatially distinct cavity arms share a common cavity portion in which portions of intracavity light corresponding to the at least two multiple spatially distinct cavity arms spatially and, optionally, collinearly overlap.

The invention as recited in claims appended to this disclosure is intended to be assessed in light of the disclosure as a whole, including features disclosed in prior art to which reference is made.

While the description of the invention is presented through the above examples of embodiments, those of ordinary skill in the art understand that modifications to, and variations of, the illustrated embodiments may be made without departing from the inventive concepts disclosed herein. Furthermore, disclosed aspects, or portions of these aspects, may be combined in ways not listed above.

To this end, for example, while a spatially-distinct cavity arm of the complex laser cavity networks of most of the above-discussed examples was shown to be terminated with the corresponding VECSEL medium (such as, for instance, the arm 110 of FIG. 1 was shown to end at the VECSEL 114), it is appreciated that generally an additional reflector can be optically juxtaposed with and coupled to a VECSEL medium, as understood by a person of skill in the art, such that the end of the corresponding cavity arm is defined by such additional reflector.

Figure 12:
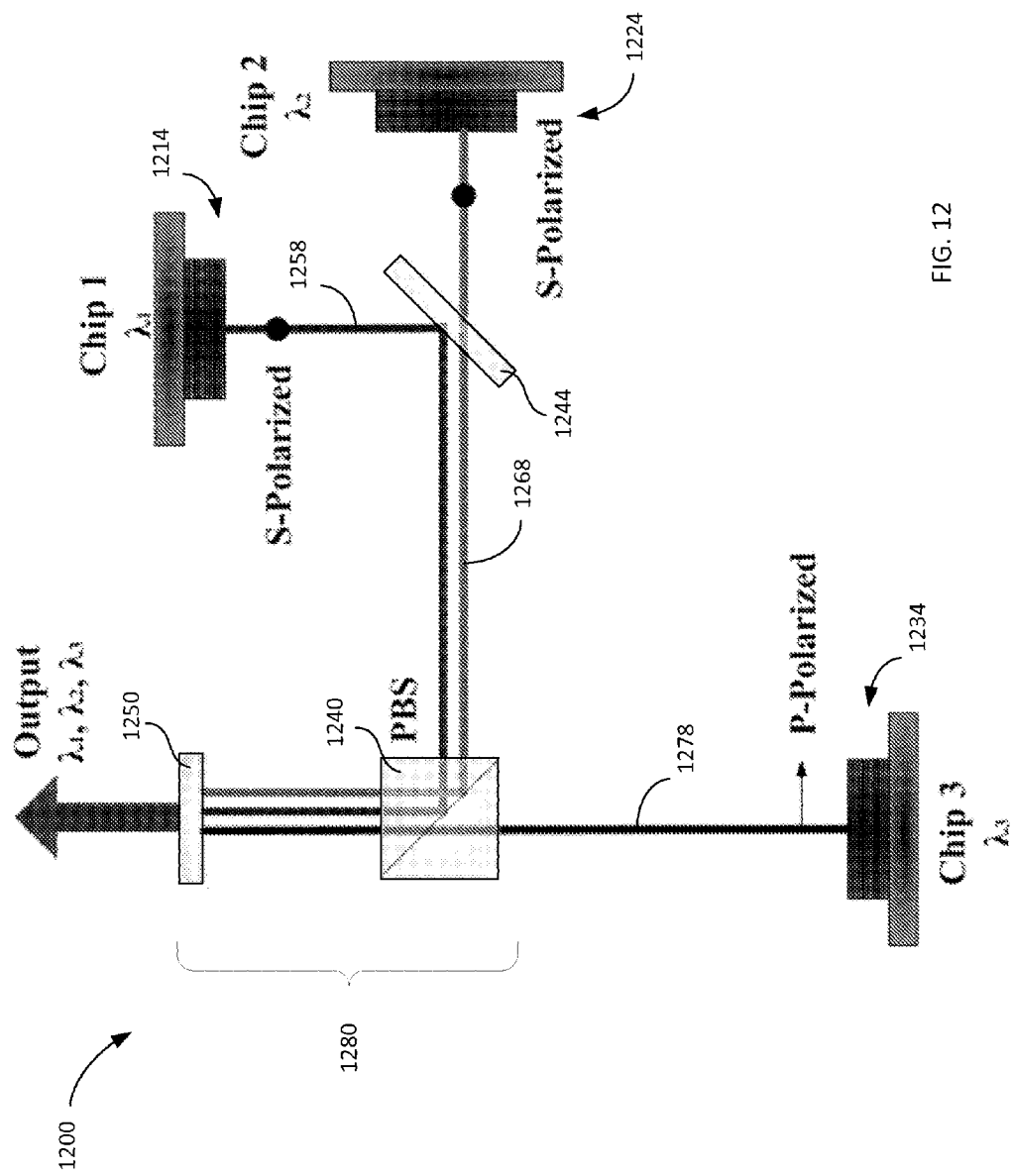
FIG. 12 is an alternative embodiment structured to generate light at three independently tunable wavelengths.
Figure 13A:
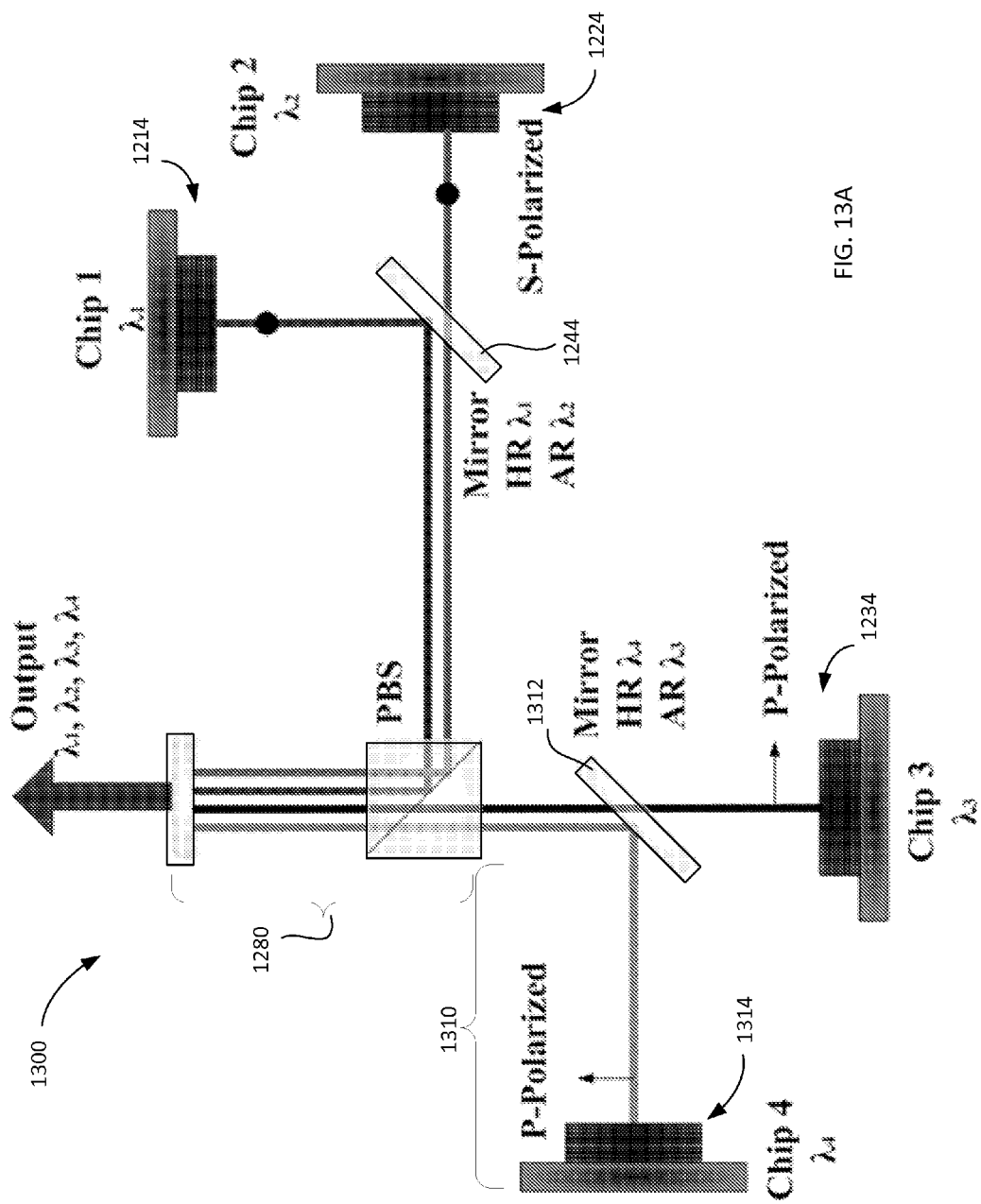
FIG. 13A is an alternative embodiment structure to support generation of light at four independently tunable wavelengths.
Figure 13B:
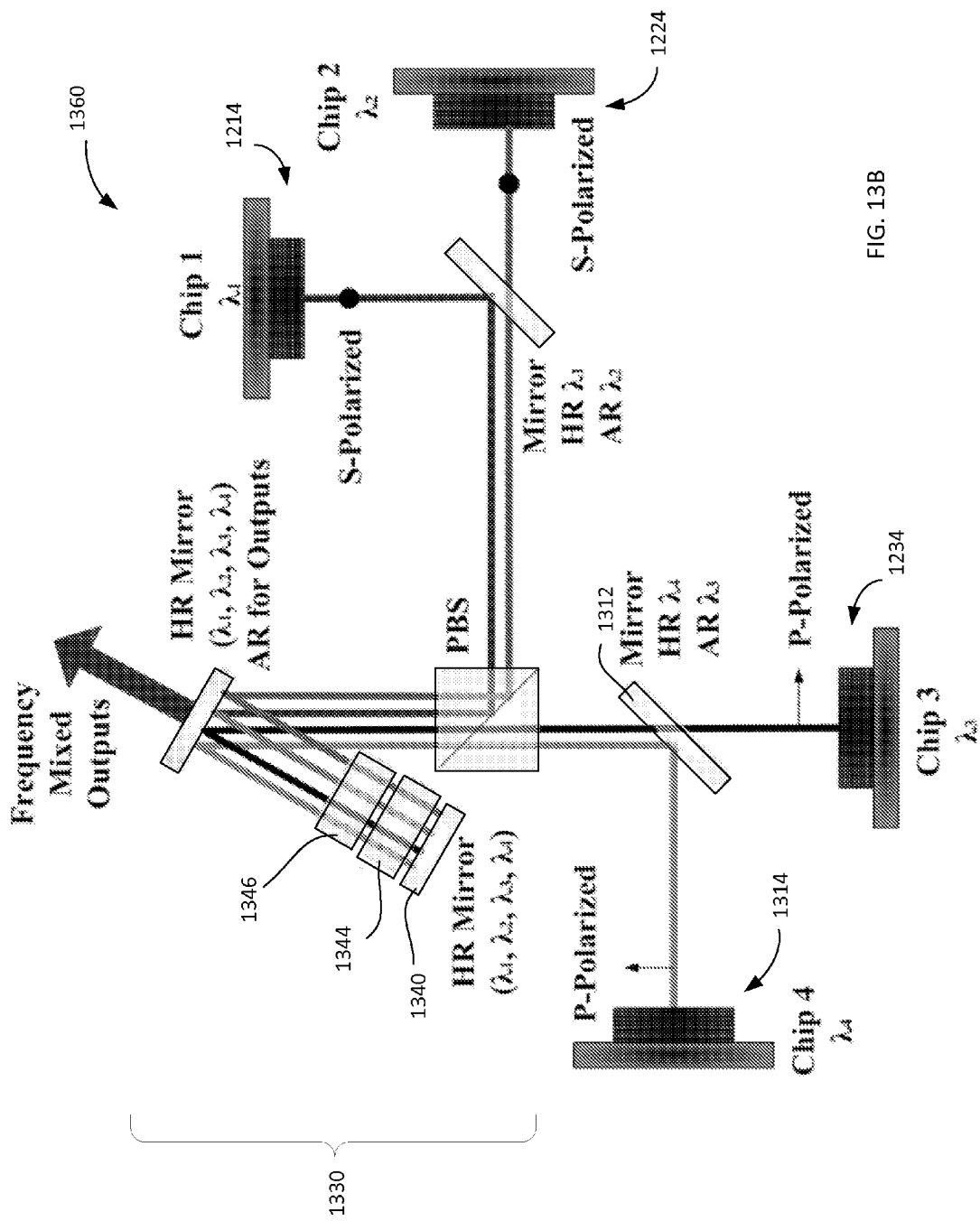
FIG. 13B is a modification of the embodiment of FIG. 13A structured to facilitate non-linear intracavity frequency mixing process(es).

Further to this end, an alternative embodiment of the invention supporting the generation of light at three independently tunable wavelengths can be constructed according to the scheme of FIG. 12, in which the three spatially-distinct arms of the overall laser cavity network 1200 are terminated with corresponding VECSELS 1214, 1224, 1234 and the intracavity optical elements (among which there are present the PBS 1240, the dichroic beamsplitter 1244, and the output coupler 1250) are chosen to ensure that optical fields 1258, 1268, 1278 (circulating intracavity at corresponding wavelengths $\lambda_1$, $\lambda_2$, $\lambda_3$) have, respectively, s-polarization, s-polarization, and p-polarization and spatially overlap in the collinear, shared portion 1280 of the cavity network. To ensure the output at any of the three wavelengths, the beamsplitter 1244 may be structured as a high-level reflector at $\lambda_1$ and be AR-coated for $\lambda_2$. Furthermore, the "base" cavity network design of FIG. 1 or FIG. 5 can be additionally expanded to incorporate additional gain media and intracavity optics to achieve the desired combination of independently tunable lasing wavelengths at the output of the VECSEL device. FIG. 13A, for example, illustrates schematically an embodiment 1300 enabling four-color laser output, while the expanded version 1360 of the embodiment 1300 shown in FIG. 13B provides for the four-color laser output with frequency mixing. In FIG. 13A, in comparison with the embodiment of FIG. 12, another cavity arm 1310 was added to the cavity network with the use of the beamsplitter 1312. The cavity arm 1310 contains the dedicated VECSEL gain medium 1314 and facilitates the generation of light at $\lambda_4$. In any of the "multicolor" cavity configurations, a cavity fold 1320 can be incorporated in the collinear, shared portion 1330 of the cavity at an intracavity reflector 1340 that is common to all intracavity-supported optical fields to allow the use of a non-linear frequency-mixing element(s) (positioned across the optical path in the cavity fold). In one instance, two non-linear crystals 1344, 1346 can be used to simultaneously non-linearly mix $\lambda_1$ with $\lambda_2$, and $\lambda_3$ with $\lambda_4$. It is appreciated that for practical purposes there is no limit on which frequency-mixing combination can be realized, and further expansion of the cavity network is not precluded to increase the number of independently tunable wavelength at the output of the device.

A spectrally-selective element utilized in at least one of the spatially-distinct cavity arms can include at least one diffraction grating (in a specific embodiment, two diffraction gratings arranged, with respect to the corresponding gain medium of the chosen cavity arm, in Littrow configuration). In one of the embodiments, it is possible to realize not only the wavelength tuning according to the embodiment of the invention to achieve as small as spectral separations between the wavelengths of the laser output as THz or even zero, but also, in addition or alternatively, the tuning of a spectral linewidth of at least one of the components of the light output. Here, in further reference to FIG. 1, one of the cavity arms—for example, the arm 110—can be structured to contain the BF 126, while another cavity arm—arm 120—is structured to include, in addition to its own BF 136, an optical etalon (optical resonator, not shown, across the beam 138) the tuning of which facilitates the change of the linewidth of the portion of the output 150 associated with 22.

A method for operating an embodiment of the invention includes the steps of optionally independent tuning of various components of a complex cavity network of the invention as described to achieve a light output containing at least two wavelengths at least one of which is tunable independently from another such as to achieve a variable spectral separation (including a zero spectral separation) between these at least two wavelengths. Such tuning can be optionally implemented with the use of a programmable computer processor or a programmable data-processing electronic circuitry that is operably coupled with a tangible, non-transitory storage medium carrying appropriate program code(s) with instructions enabling the circuitry to implement the tuning of the laser device of the invention. The instructions may be encoded in a computer readable medium comprising, for example, a magnetic information storage medium, an optical information storage medium, an electronic information storage medium, and the like. "Electronic storage media," may mean one or more devices, such as, for example and without limitation, a PROM, EPROM, EEPROM, Flash PROM, compactflash, smartmedia, and the like.

While the preferred embodiments of the present invention have been illustrated in detail, it should be apparent that modifications and adaptations to those embodiments may occur to one skilled in the art without departing from the scope of the present invention. The invention should not be viewed as being limited to the disclosed embodiment(s).

What is claimed is:

1. A laser source structured to generate a spectrally tunable light output, the laser source comprising:
   a laser cavity network containing at least one output coupler and multiple spatially-distinct cavity arms, a first arm and a second arm each
     structured to support intracavity circulation of laser light at at least one wavelength, and
     employing a corresponding laser gain medium designed to amplify light at such at least one wavelength, and
     sharing a common portion of the laser cavity network containing a first output coupler through which said spectrally-tunable light output including multiple wavelengths is extracted from the cavity network, and
   at least one wavelength tuning mechanism juxtaposed with the cavity network and operable to tune a first wavelength of said multiple wavelengths independently with respect to a second wavelength of said multiple wavelengths while allowing the first and second wavelengths to become equal as a result of tuning.

2. A laser source according to claim 1, wherein said first output coupler is the only output coupler of the laser source.

3. A laser source according to claim 1, wherein a gain medium includes a VECSEL-based gain medium.

4. A laser source according to claim 1, wherein laser light portions corresponding to at least two of said multiple wavelengths co-linearly overlap in said common portion of the laser cavity network.

5. A laser source according to claim 1, the cavity network of which is devoid of an intracavity optical resonator and wherein the spectrally-tunable light output includes first and second wavelengths that are independently tunable with respect to one another.

6. A laser source according to claim 1, wherein at least one spatially-distinct cavity arm includes an element defining a pulsed operation of said laser source.

7. A laser source according to claim 1, further comprising a non-linear optical element disposed to define a third wavelength in said spectrally-tunable output, said third wavelength caused by non-linear interaction of light at the first and second wavelengths.

8. A laser source according to claim 7, wherein a frequency of the spectrally-tunable output corresponding to the third wavelength is tunable from a THz range of frequencies to a mid-IR range of frequencies.

9. A laser source according to claim 7, wherein said third wavelength corresponds to the ultra-violet portion of the optical spectrum.

10. A laser source according to claim 1, further comprising a wavelength-selective element disposed intracavity in one of the multiple spatially distinct cavity arms, said wavelength-selective element operable to tune a spectral linewidth of light supported by said cavity arm.

11. A laser source according to claim 1, further comprising, in said common cavity portion, an optical element defining a spatial fold in the common cavity portions and forming Rayleigh regions of intracavity light portions corresponding to the first and second wavelengths that spatially overlap in said spatial fold.

12. A laser source according to claim 11, wherein said Rayleigh ranges regions overlap collinearly.

13. A laser source having a single output coupler and structured to generate a spectrally tunable light output therethrough, said light output including multiple wavelengths, the laser source comprising:
a laser cavity network containing multiple spatially-distinct cavity arms, a first arm and a second arm each
structured to support intracavity circulation of laser light at a corresponding wavelength from the multiple wavelengths;
containing a corresponding VECSEL gain medium designed to amplify light at the corresponding wavelength; and
sharing a common portion of the laser cavity network, which common portion is traversed by light at said multiple wavelengths, and
a wavelength tuning mechanism disposed in the first cavity arm and operable to tune a first wavelength of light supported by first cavity arm independently from a second wavelength of light supported by the second cavity arm while allowing said first and second wavelengths to become equal as a result of tuning.

14. A laser source according to claim 13, further comprising a wavelength-selective element disposed intracavity in one of the multiple spatially distinct cavity arms, said wavelength-selective element operable to tune a spectral linewidth of light supported by said cavity arm.

15. A laser source according to claim 13, further comprising a laser-mode selector in the first cavity arm, said selector defining a pulsed operation of the laser source at the first wavelength.

16. A laser source according to claim 15, in which a portion of the spectrally-tunable light output at the second wavelength includes a continuous wave light output.

17. A laser source according to claim 13, wherein the common portion of the laser cavity network includes a spatial fold defined by the single output coupler and an auxiliary optical element disposed in the spatial fold such as to support a non-linear frequency generation of light at a third wavelength, said generation occurring collinearly and coaxially with propagation of light at the first wavelength.

18. A laser source according to claim 13, the laser cavity network of which is devoid of an intracavity optical resonator and wherein both the first and second wavelengths are independently tunable with respect to one another.

* * * * *